United States Patent [19]
Azar

[11] Patent Number: 5,920,458
[45] Date of Patent: Jul. 6, 1999

[54] ENHANCED COOLING OF A HEAT DISSIPATING CIRCUIT ELEMENT

[75] Inventor: Kaveh Azar, Westwood, Mass.

[73] Assignee: Lucent Technologies Inc., Murray Hill, N.J.

[21] Appl. No.: 08/864,980

[22] Filed: May 28, 1997

[51] Int. Cl.[6] .................................................... H05K 7/20
[52] U.S. Cl. ..................... 361/704; 361/719; 257/706; 257/713; 257/720; 257/783; 174/252
[58] Field of Search .................................. 361/689, 698, 361/699, 701, 703, 704, 711, 707, 717, 718, 719, 720; 257/712, 713, 716, 717, 718, 719, 722; 174/15.1, 16.3

[56] References Cited

U.S. PATENT DOCUMENTS

| | | | |
|---|---|---|---|
| 4,340,902 | 7/1982 | Honda et al. | 257/722 |
| 4,729,060 | 3/1988 | Yamamoto et al. | 361/700 |
| 5,014,904 | 5/1991 | Morton | 174/16.3 |
| 5,172,301 | 12/1992 | Schneider | 361/717 |
| 5,467,251 | 11/1995 | Katchmar | 361/719 |
| 5,659,458 | 8/1997 | Patchen | 361/704 |

Primary Examiner—Leo P. Picard
Assistant Examiner—Boris L. Chervinsky

[57] ABSTRACT

An arrangement for cooling a heat dissipating circuit element mounted to a first side of a printed circuit board. A heat dissipation member is mounted to the other side of the circuit board and a thermally conductive post secured to the heat dissipation member extends through an aperture through the circuit board and into thermal contact with the circuit element.

5 Claims, 3 Drawing Sheets

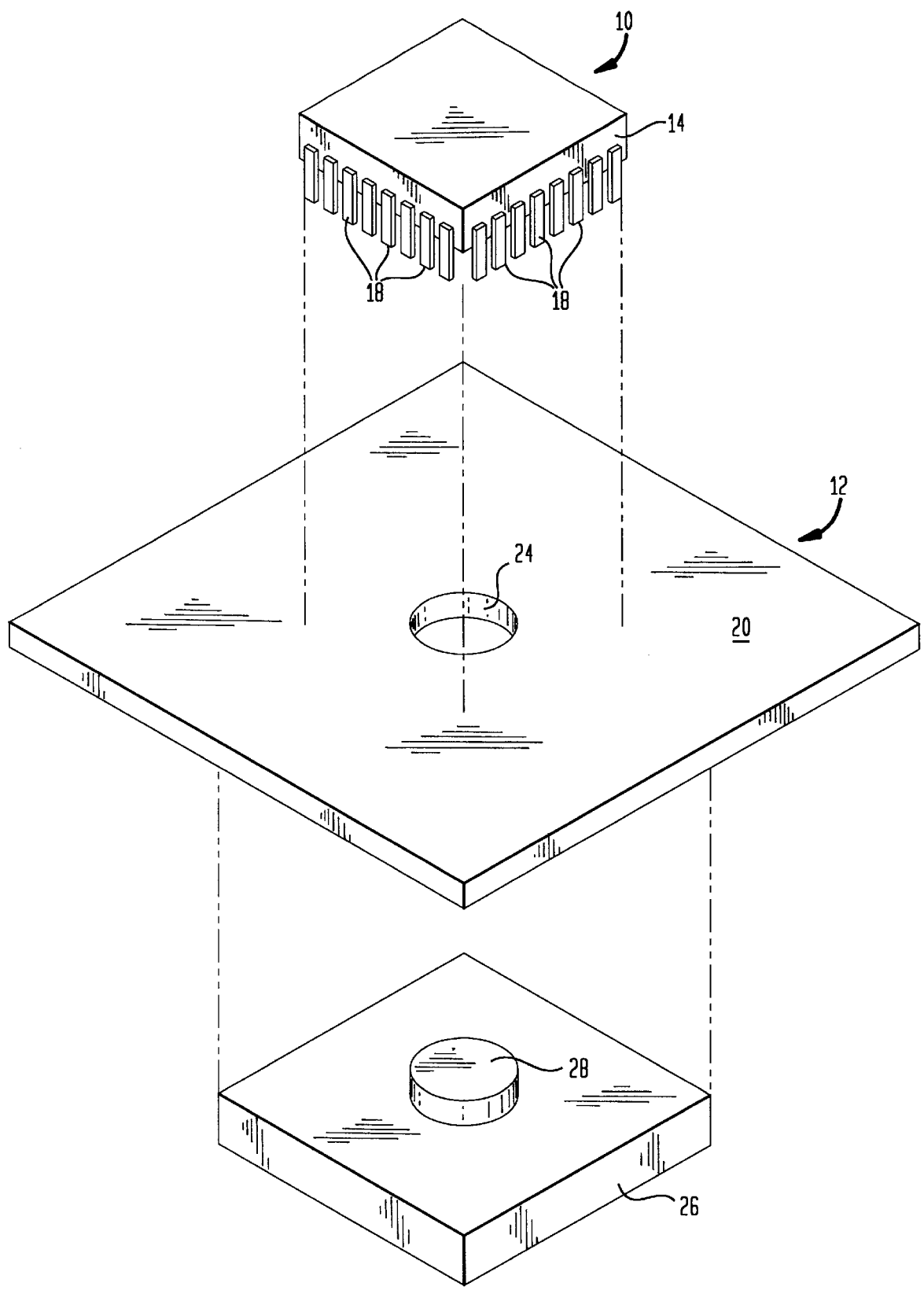

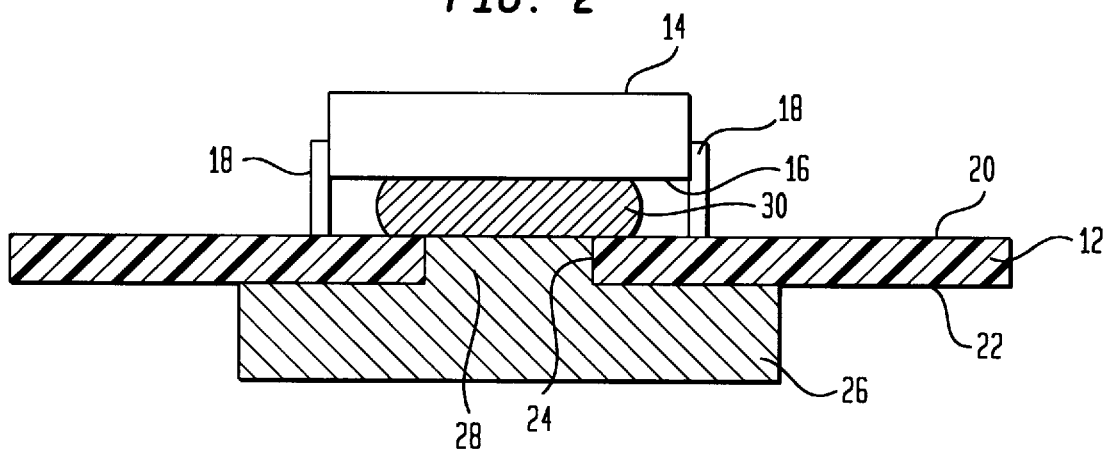
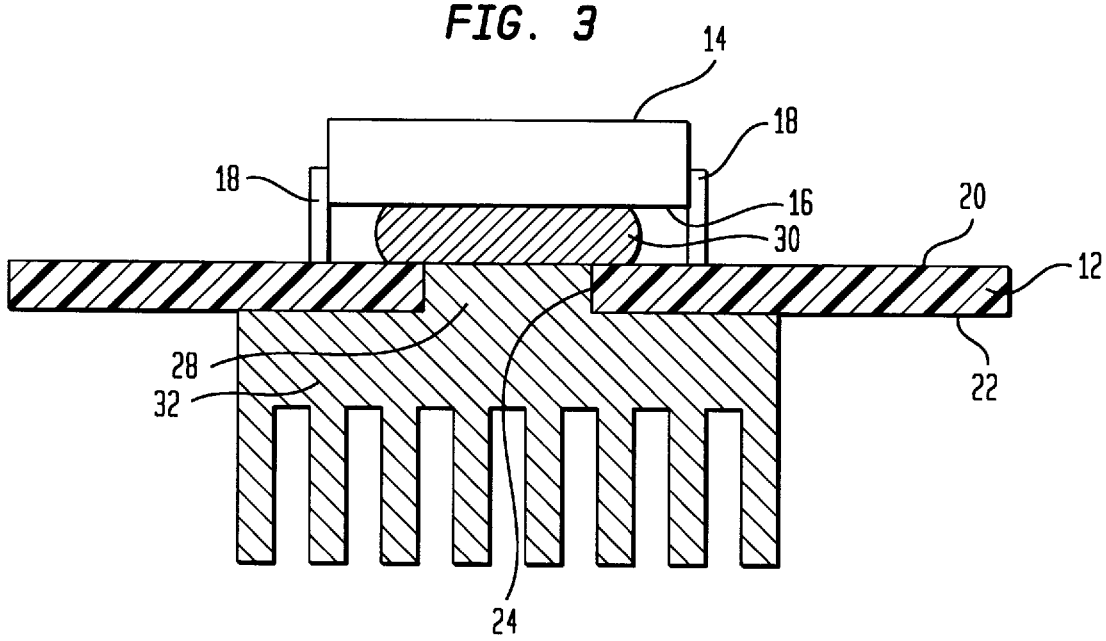

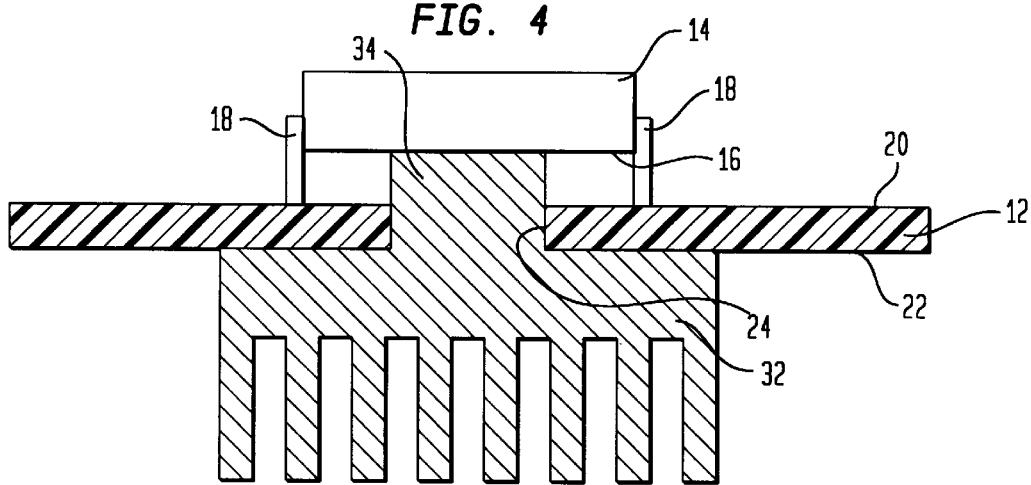
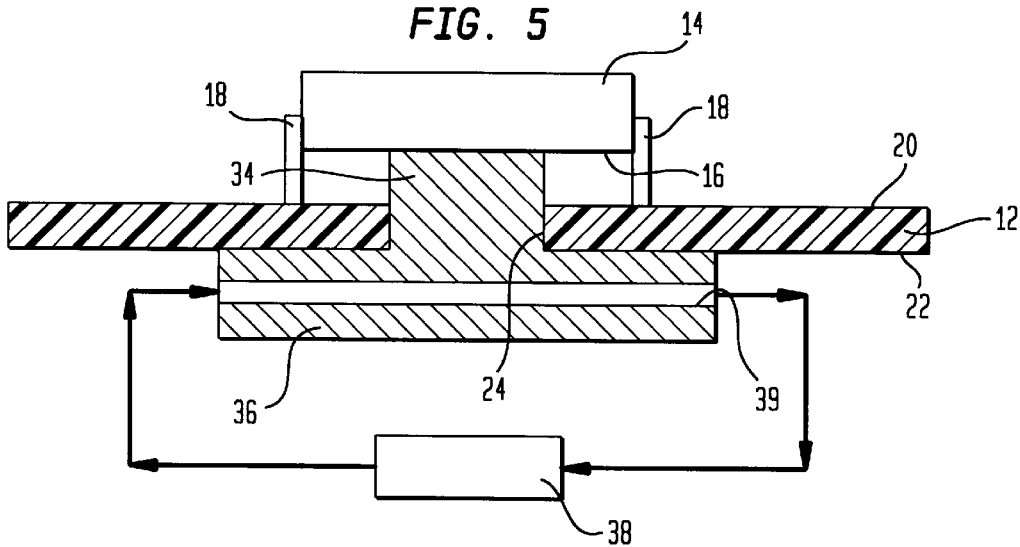
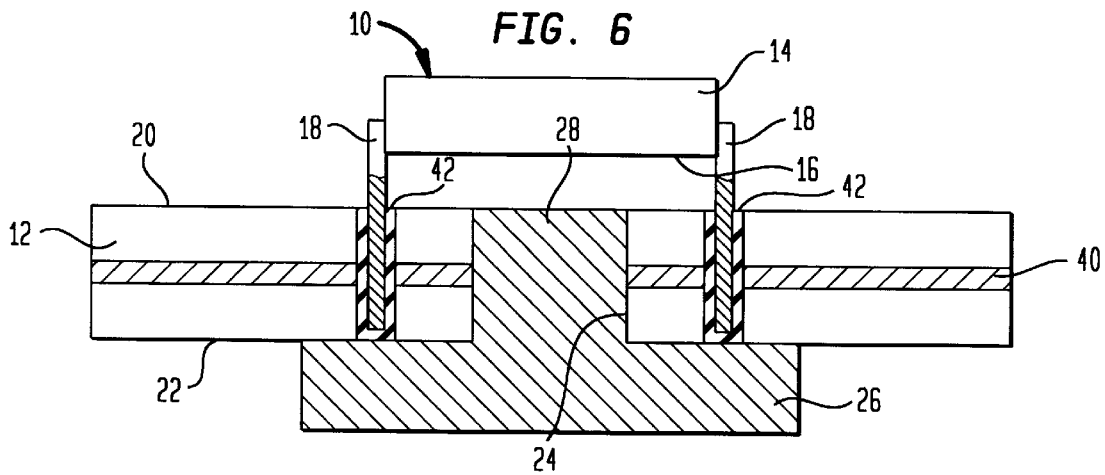

ENHANCED COOLING OF A HEAT DISSIPATING CIRCUIT ELEMENT

BACKGROUND OF THE INVENTION

This invention relates to the cooling of a heat dissipating circuit element and, more particularly, to an arrangement and method for providing enhanced cooling of such an element which is mounted to a printed circuit board.

In recent years, there has been a rapid development of high power electronic components to meet increasing demands on performance and size of electronic systems. Such components may be encapsulated within an hermetic enclosure and have a plurality of leads extending from the enclosure. The leads are utilized both for mounting the component to the printed circuit board and for providing electrical interconnections between the printed circuit board and the component. Generally, such components are only mounted to one side of a printed circuit board. As the density of such components on the circuit board increases, the heat generated on that side of the circuit board is increased while at the same time the amount of area available for heat dissipation on that side of the circuit board is reduced. It would therefore be desirable to be able to utilize the other side of the printed circuit board for heat dissipation.

SUMMARY OF THE INVENTION

In accordance with the principles of this invention, there is provided an arrangement for cooling a heat dissipating circuit element mounted to a printed circuit board having first and second major planar surfaces. The circuit element has a heat conducting surface spaced from and facing the first major surface of the printed circuit board. A plurality of connection elements of the circuit element are utilized for mounting the circuit element in spaced relation to the first major surface of the printed circuit board and for providing electrical interconnections between the printed circuit board and the circuit element. The inventive cooling arrangement comprises a thermally conductive heat dissipation member and a thermally conductive post. The heat dissipation member is secured to the second major surface of the printed circuit board. The post is in thermal contact with the heat conducting surface of the circuit element and extends through an aperture through the printed circuit board to be secured to the heat dissipation member. Accordingly, heat produced by the circuit element is transferred to the post and conducted by the post through the circuit board to the heat dissipation member on the other side of the circuit board from the circuit element.

In accordance with an aspect of this invention, the post is in direct contact with the heat conducting surface.

In accordance with another aspect of this invention, a thermally conductive compound is interposed between and in contact with the post and the heat conducting surface.

In accordance with a further aspect of this invention, the heat dissipation member is formed with at least one throughbore and the inventive cooling arrangement further comprises a supply of fluid coolant and a flow controller arranged to effect passage of the coolant through the throughbore.

The present invention thus proposes a method for providing additional heat dissipation for a circuit element mounted to a printed circuit board. The circuit element has a heat conducting surface and a plurality of connection elements mount the circuit element in spaced relation to a first side of the circuit board. The inventive method comprises the steps of providing an aperture through the circuit board in registration with the heat conducting surface, providing a thermally conductive post, inserting the post through the aperture, placing the post in thermal contact with the heat conducting surface, providing a thermally conductive heat dissipation member, and securing the heat dissipation member to the side of the circuit board opposite the first side and in thermal contact with the post. Accordingly, enhanced cooling of a circuit element on a printed circuit board can be effected without redesign of the circuit board and without requiring a customized circuit element.

BRIEF DESCRIPTION OF THE DRAWINGS

The foregoing will be more readily apparent upon reading the following description in conjunction with the drawings in which like elements in different figures thereof are identified by the same reference numeral and wherein:

FIG. 1 is an exploded perspective view illustrating the general concept of the inventive enhanced cooling arrangement;

FIG. 2 is a cross sectional view schematically illustrating a first embodiment of the inventive cooling arrangement;

FIG. 3 is a cross sectional view schematically illustrating a second embodiment of the inventive cooling arrangement;

FIG. 4 is a cross sectional view schematically illustrating a third embodiment of the inventive cooling arrangement;

FIG. 5 is a cross sectional view schematically illustrating a fourth embodiment of the inventive cooling arrangement; and FIG. 6 is a cross sectional view schematically illustrating a fifth embodiment of the inventive cooling arrangement.

DETAILED DESCRIPTION

Referring now to the drawings, FIG. 1 illustrates the general concept of the present invention. As shown therein, an electronic component 10 is arranged to be mounted to a printed circuit board 12. For illustrative purposes, the electronic component 10 can be considered to include circuit elements, such as integrated circuit chips, encapsulated within an hermetic enclosure 14 which has a substantially planar lower surface 16 (FIG. 2). Leads 18 are connected to the circuit elements within the enclosure 14 and extend out from the enclosure 14. As is conventional, the leads 18 are utilized for mounting the component 10 to the printed circuit board 12 and for providing electrical interconnections between the circuit board 12 and the circuit elements of the component 10. The circuit board 12 has a first major planar surface 20 and a second major planar surface 22 (FIG. 2). Thus, the leads 18 are used to mount the electronic component 10 to the circuit board 12 with the lower surface 16 of the component 10 being spaced from and substantially parallel to the first surface 20 of the circuit board 12.

According to the present invention, the circuit board 12 is formed with an aperture 24 extending between its surfaces 20, 22. The aperture 24 is in registration with the component 10 after it is mounted to the board 12 and at the same time does not interfere with the leads 18. Thus, if the leads 18 extend from all four sides of a rectangular enclosure 14, the aperture 24 is within the area having a periphery defined by the leads 18.

The aperture 24 is utilized in the transferring of heat from the component 10 on the first side of the circuit board 12 to the second side of the circuit board 12 from which it is to be dissipated. To accomplish that result, a thermally conductive heat dissipation member 26, illustratively a substantially flat slab, is secured to the surface 22 of the circuit board 12. The heat dissipation member 26 covers the aperture 24. A thermally conductive post 28 is secured at one end to the heat dissipation member 26 and extends through the aperture 24 to the first side of the circuit board 12. On the first side of the circuit board 12, the post 28 is placed in thermal contact with the enclosure 14 of the component 10. Accordingly, heat produced by the component 10 is transferred to the post 28 and conducted by the post 28 through the circuit board 12 to the heat dissipation member 26 on the other side of the circuit board 12 from the component 10, thereby providing enhanced cooling of the component 10.

According to a first embodiment of the present invention, as shown in FIG. 2, the length of the post 28 is substantially equal to the thickness of the circuit board 12 and thermal contact between the post 28 and the lower surface 16 of the enclosure 14 is effected by providing a thermally conductive compound 30 in thermal contact with both the upper surface of the post 28 and the lower surface 16 of the enclosure 14. Illustratively, the compound 30 can be solder or a conductive compound, such as an epoxy. When providing the compound 30 in the space between the component 10 and the printed circuit board 12, care must be taken to ensure that the compound 30 does not contact the leads 18.

A second embodiment of the present invention is illustrated in FIG. 3 wherein the heat dissipation member is in the form of a finned heat sink 32.

FIG. 4 illustrates another embodiment of the present invention wherein the post 34 is elongated relative to the post 28 and is in direct thermal contact with the lower surface 16 of the enclosure 14. While FIG. 4 shows the finned heat sink 32 as the heat dissipation member, it is understood that a substantially flat slab can be utilized in place of the heat sink 32.

In the embodiment shown in FIG. 5, the heat dissipation member comprises a hollow core heat exchanger 36. A flow controller 38, which may be a refrigerator-type device, is in fluid communication with a throughbore 39 of the heat exchanger 36, as shown. Either liquid or air can be utilized as a coolant and the flow controller 38 effects the passage of such coolant through the throughbore 39 of the heat exchanger 36.

According to yet another embodiment of the present invention, as shown in FIG. 6, the printed circuit board 12 is formed with an internal metallization layer 40 in the vicinity of the component 10 and surrounding the aperture 24. The leads 18 pass through insulated vias 42 of the circuit board 12 so they do not contact the metallization layer 40. However, the thickness of the insulation layer within the vias 42 is sufficiently thin that heat conducted by the contacts 18 from the circuit elements within the enclosure 14 is transferred to the metallization layer 40. This heat is then conducted by the metallization layer 40 to the periphery of the aperture 24, at which location the metallization layer 40 is in thermal contact with the post 28 so that the heat is then conducted by the post 28 to the heat dissipation member 26. While not specifically shown in FIG. 6, there can also be direct contact between the post 28 and the surface 16 or there can be a conductive compound between the post 28 and the surface 16.

Although specific heat dissipation members have been shown in specific illustrative embodiments, it is understood that the heat dissipation members are all interchangeable. The heat dissipation member can be made of any thermally conductive material (e.g., metal, metal composite, polymer) and can be screwed, press-fit, epoxied, soldered or made as an integral part of the printed circuit board. The post can be of any desired geometric shape that can readily fit into the circuit board aperture. It can be threaded at both ends or knurled to accommodate mechanical attachment to the circuit board. The post can also be made of heat pipes to further enhance heat conduction from the component.

Thus, as described, the present invention provides for enhanced cooling of a conventional electronic component by making available, on the other side of the circuit board from the component, an additional surface for heat dissipation. By utilizing an aperture through the circuit board, a heat conducting post inserted through the aperture allows for the transfer of heat from one side of the circuit board to the other. This is accomplished without requiring the design of customized components. Alternatively, the enclosure of the component can be designed to include an internal heat slug extending toward or beyond the lower surface of the component enclosure for more effective contact with the heat post. Thus, the present invention eliminates the interfacial thermal resistance between the component and the printed circuit board.

While the present invention has been illustrated for enhanced cooling of an hermetically encapsulated electronic component, it will be appreciated that the inventive principles can be utilized with any heat dissipating circuit element. Such element does not have to have a planar surface, since a conductive compound can be utilized to ensure good surface contact on other than a planar surface. Further, while conventional leads have been illustrated for mounting the component, it will be appreciated that the invention can be practiced with circuit elements having other types of connection elements, such as ball grid solder bumps.

Accordingly, there has been disclosed an improved arrangement and method for providing enhanced cooling of a heat dissipating circuit element mounted to a printed circuit board. It is understood that the above-described embodiments are merely illustrative of the application of the principles of this invention. Numerous other embodiments may be devised by those skilled in the art without departing from the spirit and scope of this invention, and it is intended that this invention be limited only by the scope of the appended claims.

What is claimed is:

1. An arrangement for cooling a circuit element mounted to a printed circuit board having first and second major planar surfaces, the circuit element having a plurality of connection elements for mounting said circuit element in spaced relation to said first major surface of said printed circuit board and for providing electrical interconnections between said printed circuit board and said circuit element, the cooling arrangement comprising:

a thermally conductive heat dissipation member secured to said second major surface of said printed circuit board;

a thermally conductive post secured to said heat dissipation member, said post extending through an aperture through said printed circuit board; and a metallized layer internal to said printed circuit board parallel to said first and second major surfaces and electrically insulated from said connection elements, said metallized layer being sufficiently close to said connection elements so as to absorb heat which is conducted from said circuit element by said connection elements, said metallized layer extending to said aperture and being in thermal contact with said post;

whereby heat produced by said circuit element is transferred to said post and conducted by said post through said circuit board to said heat dissipation member on the other side of said circuit board from said circuit element.

2. The cooling arrangement according to claim 1 wherein said heat dissipation member comprises a finned heat sink.

3. The cooling arrangement according to claim 1 wherein said heat dissipation member comprises a substantially flat slab.

4. The cooling arrangement according to claim 1 wherein said heat dissipation member is formed with at least one throughbore and the cooling arrangement further comprises:

a supply of fluid coolant; and a flow controller arranged to effect passage of said coolant through said throughbore.

5. A method for providing additional heat dissipation for a circuit element mounted to a printed circuit board, wherein the circuit element has a plurality of connection elements for mounting the circuit element in spaced relation to a first side of the circuit board, the method comprising the steps of:

a) providing an aperture through the circuit board in registration with the circuit element;

b) providing a thermally conductive post;

c) inserting the post through the aperture;

d) providing a metallized layer internal to the circuit board, parallel to the circuit board first side, electrically insulated from the connection elements, sufficiently close to the connection elements so as to absorb heat which is conducted from the circuit element by the connection elements, and extending to the aperture in thermal contact with the post;

e) providing a thermally conductive heat dissipation member; and f) securing the heat dissipation member to the side of the circuit board opposite the first side and in thermal contact with the post.

* * * * *